(12) United States Patent
Wong

(10) Patent No.: US 7,791,387 B1
(45) Date of Patent: Sep. 7, 2010

(54) FINE-RESOLUTION EDGE-EXTENDING PULSE WIDTH MODULATOR

(75) Inventor: Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 19 days.

(21) Appl. No.: 11/204,285

(22) Filed: Aug. 14, 2005

(51) Int. Cl.
*H03K 7/08* (2006.01)

(52) U.S. Cl. ..................................... 327/172

(58) Field of Classification Search ........................ None
See application file for complete search history.

(56) References Cited

U.S. PATENT DOCUMENTS 6,472,909 B1 * 10/2002 Young ........................ 327/99
6,975,145 B1 * 12/2005 Vadi et al. ..................... 327/99
2005/0280458 A1 * 12/2005 Leung et al. ................ 327/172
2006/0001467 A1 * 1/2006 Fujino et al. ................ 327/172

* cited by examiner

*Primary Examiner*—Lincoln Donovan
*Assistant Examiner*—Khareem E Almo

(57) ABSTRACT

Fine resolution pulse width modulation is achieved through feed-forward edge extending logic. A ring-oscillator produces phase-shifted versions of a system clock and two latches operate in parallel with the system clock output from the multiplexer clocking a first latch and a selected phase-shifted version of the system clock from the multiplexer clocking the second latch. The first latch receives a coarse output pulse equal to a selected number of clock periods as an input, while the second latch receives the output of the first latch as an input. A logic gate combines outputs from the latches to produce the output pulse having a trailing edge extended by a selected number of phase divisions.

20 Claims, 17 Drawing Sheets

FINE-RESOLUTION EDGE-EXTENDING PULSE WIDTH MODULATOR

CROSS-REFERENCE TO RELATED APPLICATIONS

This application is related to the subject matter of commonly-assigned copending U.S. patent application Ser. Nos. 11/204,297 entitled DITHER SCHEME USING PULSE-DENSITY MODULATION (DITHER PDM) and 11/204,284, entitled DIGITAL DEAD-TIME CONTROLLER FOR PULSE WIDTH MODULATORS, both filed on an even date herewith. The content of the above-identified applications is hereby incorporated by reference.

TECHNICAL FIELD OF THE INVENTION

The present invention is directed, in general, to digital pulse width modulation and, more specifically, to multi-phase clocking, fine-resolution edge extending pulse width modulation.

BACKGROUND OF THE INVENTION

Pulse width modulators (PWMs) are a key circuit block in building power switching regulators. Conventional, analog technology pulse width modulator circuits must be adjusted to compensate for process-voltage-temperature (PVT) variations, while digital pulse width modulators offer much higher circuit precision tolerating wide PVT ranges. In addition, digital designs allow easy implementation of many circuit control functions, and are thus likely to be standard in future single-chip switcher designs.

Digital pulse with modulation is basically a digital controller pulse width generator where the system clock determined the pulse width accuracy and resolution. Very high system clock frequencies, greater than 100 mega-Hertz (MHz) are normally required to yield fine resolution. For instance, a 1.25 MHz, 7-bit pulse width modulator—having an 800 nanosecond (ns) pulse period with 128 resolution steps—requires a clock frequency of 160 MHz (1.25 MHz×128). This makes the design expensive and unsuitable for high-efficiency, low-power applications. To lower the clock frequency, a common practice involves utilizing a multiphase clocking scheme. However, such complex clocking systems generally result in various logic-timing problems.

There is, therefore, a need in the art for an improved digital pulse width modulator having accuracy and resolution controlled by a low frequency, multiphase clock.

SUMMARY OF THE INVENTION

To address the above-discussed deficiencies of the prior art, it is a primary object of the present invention to provide, for use in an integrated circuit requiring pulse width modulation, fine resolution pulse width modulation through feed-forward edge extending logic. A ring-oscillator produces phase-shifted versions of a system clock and two latches operate in parallel with the system clock output from the multiplexer clocking a first latch and a selected phase-shifted version of the system clock from the multiplexer clocking the second latch. The first latch receives a coarse output pulse equal to a selected number of clock periods as an input, while the second latch receives the output of the first latch as an input. A logic gate combines outputs from the latches to produce the output pulse having a trailing edge extended by a selected number of phase divisions.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 13B, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
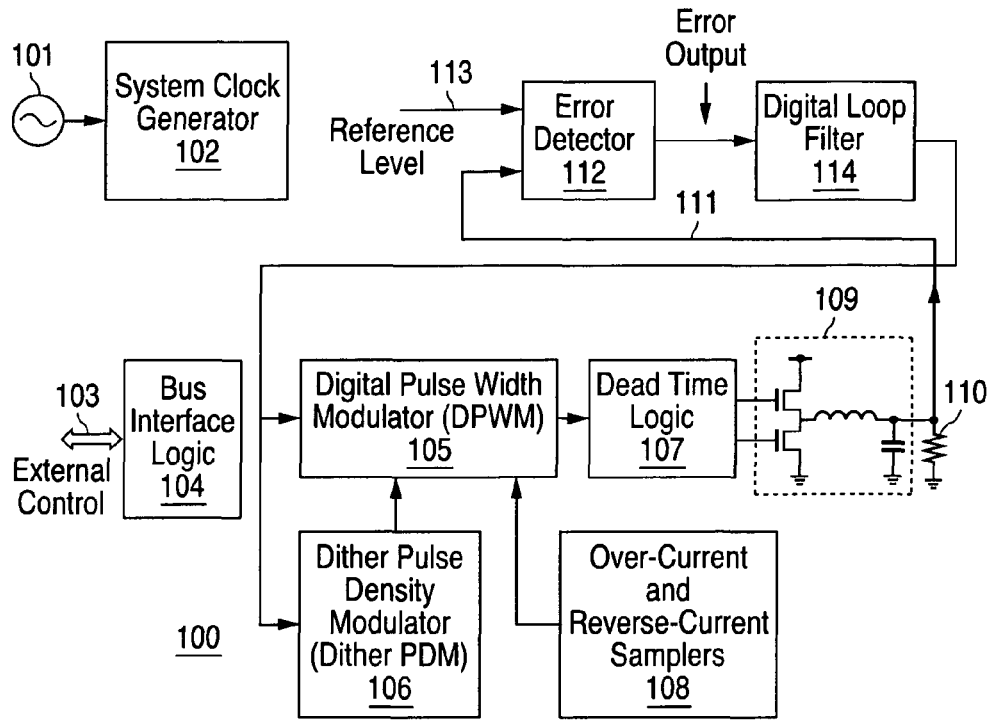
FIG. 1 is a high-level block diagram of a digital switcher core according to one embodiment of the present invention.

FIG. 1 is a high-level block diagram of a digital switcher core according to one embodiment of the present invention. Digital switcher 100 includes an external timing reference 101 employed by a system clock generator 102 to generate clock signals for various functional units (clock signal transmission paths are not shown for simplicity and clarity). Digital switcher 100 also includes input(s) 103 for external control signals, received at a bus interface logic unit 104 and employed to control various functional units (control signal paths are also not shown for simplicity and clarity). Digital switcher 100 may be integrated on a single integrated circuit chip with other functionality, such as analog-to-digital (A/D) converters, signal modulators and/or demodulators, etc. Both the external timing reference may and the external control signals may be received from outside the integrated circuit chip, or alternatively may be simply routed from other on-chip functional units.

Digital switcher 100 implements a digital pulse width modulator (DPWM) 105 coupled at an input to a dither pulse-density modulator (Dither PDM) 106 and at an output to dead time logic 107. Digital pulse width modulator 105 may also receive at an input one or more signals from over-current and reverse-current samplers 108.

Output(s) of the dead time logic 107 are coupled to a power train unit 109, which in the exemplary embodiment include switching transistors coupling an internal node to either a power supply voltage or a ground voltage, and inductive and capacitive coupling of the internal node to an output. A load 110 is coupled between the output of the power train unit 109 to the ground voltage, with current drawn through the load 110 providing a load voltage error feedback signal 111 to an error detector 112 comparing the error feedback signal 111 to a reference level 113 and generating an error output proportional to a difference between the load voltage the reference level. The error output from error detector 112 is passed to inputs of both the digital pulse width modulator 105 and the dither pulse-density modulator 106, and is employed to modulate the output of pulse width modulator 105 in order to force the error output from error detector 112 to zero.

Figure 2:
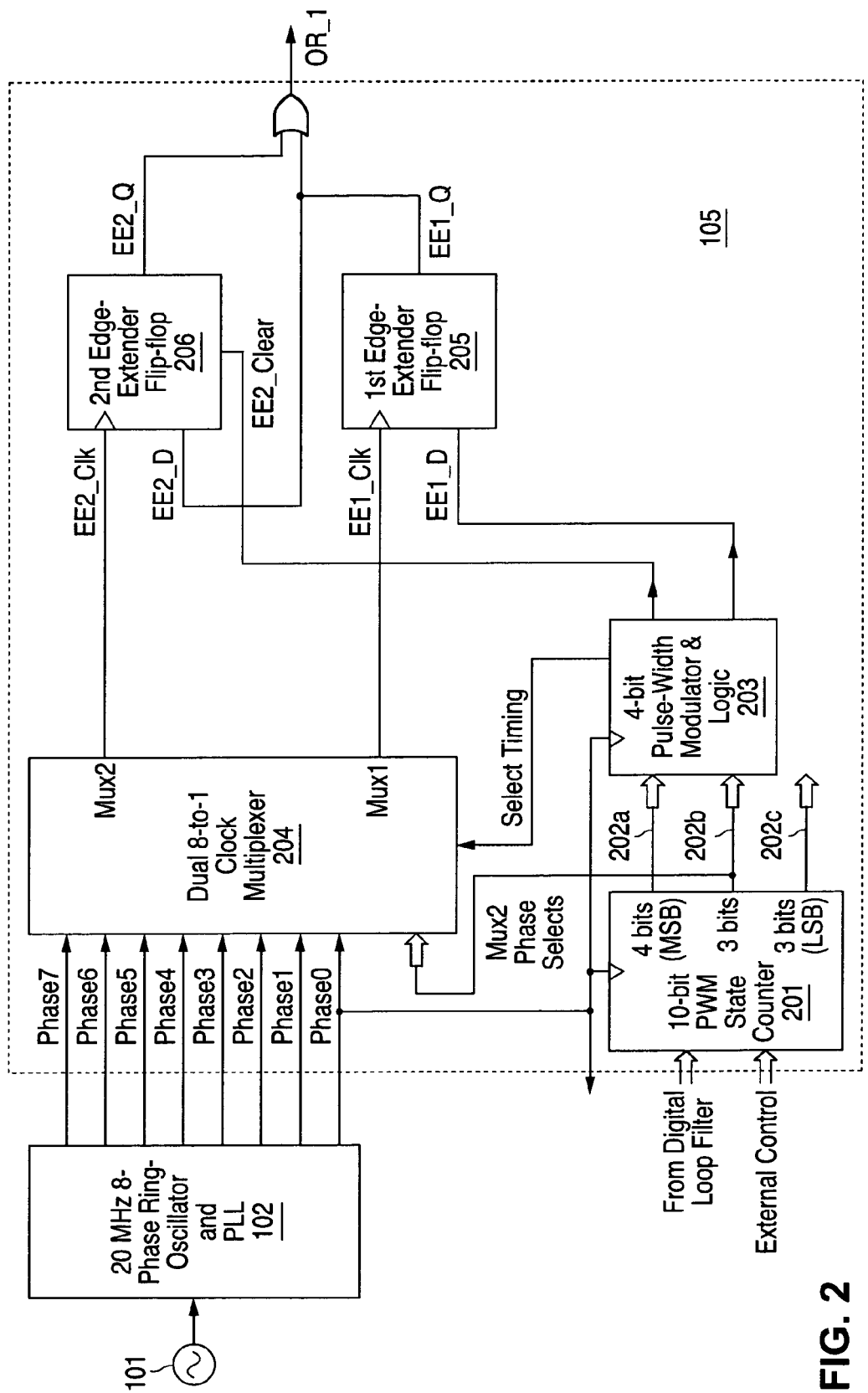
FIG. 2 is a simplified circuit diagram of a fine-resolution edge extender digital pulse width modulator with a dithering pulse-density modulator and a digital dead-time controller according to one embodiment of the present invention.
Figure 14:
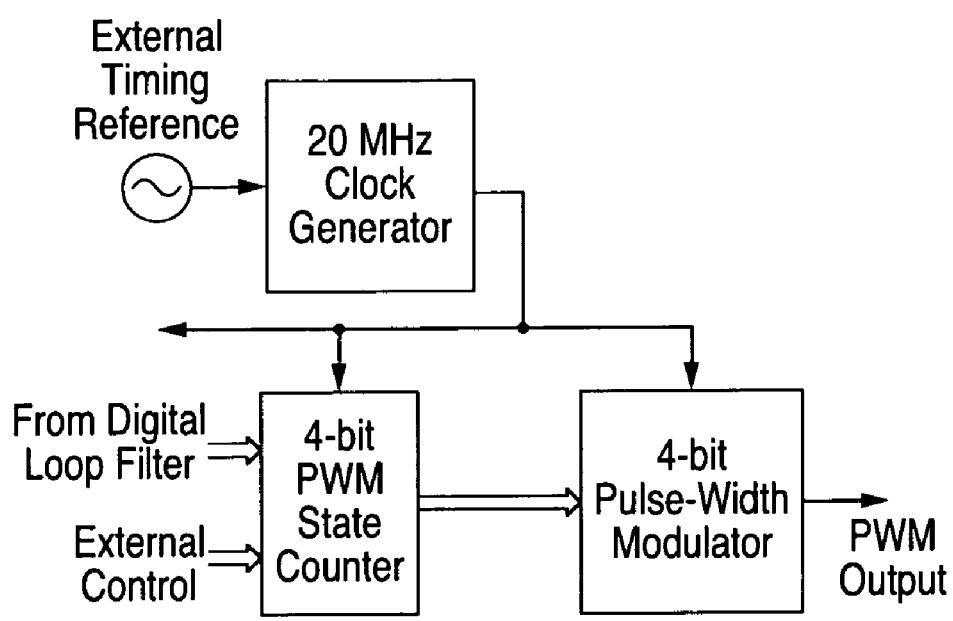
FIG. 14 depicts a simple, conventional digital pulse width modulator.

FIGS. 2 and 14 are comparative block diagrams of a fine-resolution edge extender digital pulse width modulator according to one embodiment of the present invention and a simple, conventional digital pulse width modulator. In a simple digital pulse width modulator illustrated in FIG. 14, an external timing reference received by the clock generator is employed to generate a 20 mega-Hertz (MHz) high-frequency clock that is 16 times (16×, for 4-bit resolution) the basic pulse width modulator frequency of 1.25 MHz. This 20 MHz system clock is received by a 4-bit pulse width modulator state counter receiving a control signal from an external controller and an error signal from a digital loop filter, and providing a four bit signal to a 4-bit pulse width modulator producing the pulse width modulated (PWM) output. The value of the 4-bit pulse width modulator state counter (variously "State_Counter" or "PWM_State" herein) determines the pulse width of the PWM output, with State_Counter=0 producing a PWM output pulse width of zero, State_Counter=8 producing a 50% duty cycle and State_Counter=15 producing full scale width pulses. The pulse width modulator converts the value of the 4-bit State_Counter to a pulse whose "on" time is based on the State_Counter value. The digital pulse width modulator of this example thus has a PWM output frequency of 1.25 MHz and a PWM output resolution of four bits.

In one embodiment of a fine-resolution edge extender pulse width modulator (FREE-PWM) depicted in FIG. 2, the fine-resolution, edge extender digital pulse width modulator 105 employs the external timing reference 101 at a 20 MHz, 8-phase ring oscillator and phase locked loop (PLL) system clock generator 102 producing eight phase-shifted versions ("Phase0" through "Phase7" or, equivalently, "P0" through "P7") of a 20 MHz system clock signal. One phase of the system clock signal (Phase0 in the exemplary embodiment) is routed to a 10-bit pulse width modulator state counter 201. 10-bit pulse width modulator state counter 201 receives the error signal from digital loop filter 114 and control signals from an external controller (not shown).

The four most significant bits 202a of the output from 10-bit pulse width modulator state counter 201 are passed to 4-bit pulse width modulator and logic unit 203, as are the next three bits 202b and the selected system clock phase P0. The three least significant bits 202c of the output from 10-bit pulse width modulator state counter 201 are passed to dither pulse-density modulator 106 described in further detail below.

The eight phase-shifted versions of the system clock P0-P7 are passed to a dual 8-to-1 clock multiplexer 204 having outputs Mux1 and Mux2 selected by a select timing control input signal received from the 4-bit pulse width modulator and logic unit 203. Output Mux1 always selects the system clock phase received by 10-bit pulse width modulator state counter 201 and 4-bit pulse width modulator and logic unit 203 (phase P0 in the exemplary embodiment), and is passed to the clock input EE1_Clk of a first edge extender flip-flop 205, while output Mux2 selects any one of the eight phases P0-P7 and is passed to the clock input EE2_Clk of a second edge extender flip-flop 206.

The input EE1_D to the first edge extender flip-flop 205 is an output from 4-bit pulse width modulator and logic unit 203, while the input ("EE2_D") to the second edge extender flip-flop 206 is the output EE1_Q of the first edge extender flip-flop 205. Second edge extender flip-flop 206 receives a reset signal EE2_Clear from 4-bit pulse width modulator and logic unit 203. The respective outputs EE1_Q and EE2_Q of the first and second edge extender flip-flops 205 and 206 are received by a logic OR gate OR_1, which produces the corresponding output signal OR_1, the fine-resolution edge extender pulse width modulation output forwarded (with rising edge advancement by dither pulse-density modulator 106 in the exemplary embodiment, as described in further detail below) to dead time logic 107.

The exemplary embodiment illustrated in FIG. 2 has a pulse width modulation frequency of 1.25 MHz, four bits of coarse pulse width modulation resolution, three bits for fine-resolution edge extending pulse width modulation, and three bits of dither resolution. However, other combinations of these parameters are possible.

Figure 3:
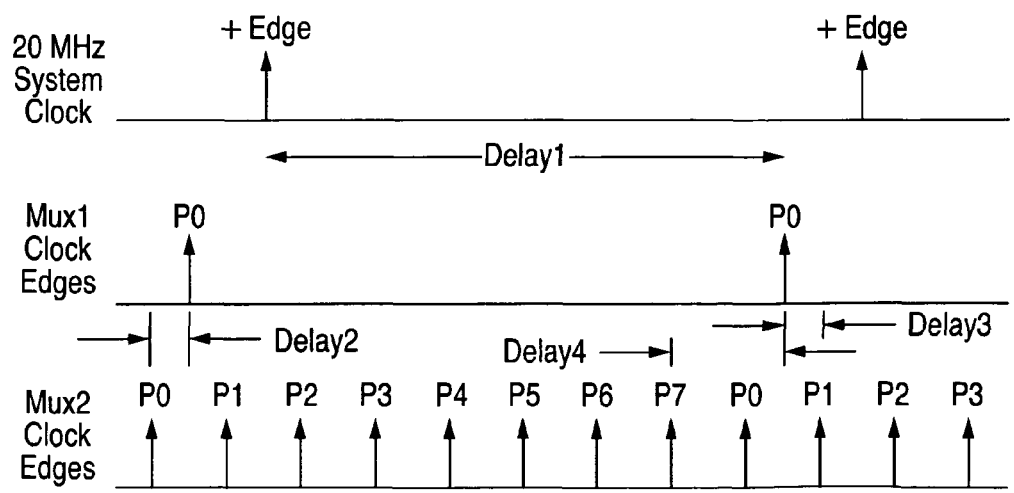
FIG. 3 illustrates the fine-resolution edge extender pulse width modulation multi-phase clocking scheme according to one embodiment of the present invention.

FIG. 3 illustrates the fine-resolution edge extender pulse width modulation multi-phase clocking scheme according to one embodiment of the present invention. The 20 MHz system clock—that is, the output phase from 8-phase ring oscillator and phase locked loop system clock generator 102 selected to clock 10-bit pulse width modulator state counter 201 and 4-bit pulse width modulator and logic unit 203, or phase P0 in the exemplary embodiment—is used to clock all logic blocks except the first and second edge extender flip-flops 205 and 206.

The output Mux1 clock edges (phase P0 in the exemplary embodiment) are utilized to resynchronize the coarse pulse width modulator output from 4-bit pulse width modulator and logic unit 203 to the Mux2 output timing via signal EE1_Q. Delay1, the skew between a rising edge of the system clock and the corresponding Mux1 clock edge, is caused by clock buffers and other fixed delays. The first edge extender flip-flop 205 is utilized to absorb Delay1.

When Phase0 is selected for Mux2, EE2_Clear is asserted to cause the output of second edge extender flip-flop 206 to go low and be ignored by OR_1. Therefore Delay2, the skew between Mux1 and Mux2, is non-critical. Mux2 is employed to edge-extend EE1_Q, where EE2_Q is the extended output. Delay3, the skew between a clock edge of Mux1 (for phase P0 in the exemplary embodiment) and a clock edge on Mux2 corresponding to the next subsequent phase (P1 in the exemplary embodiment), is the minimum setup time for the second edge extender flip-flip 206, while Delay4, the skew between a clock edge of Mux1 (for phase P0) and a clock edge on Mux2 corresponding to the last previous phase (P7 in the exemplary embodiment), is the minimum hold time for second edge extender flip-flip 206. Delay3 and Delay4 need not be identical values (i.e., Delay3≠Delay4; Delay2≠0).

The multi-phase clocking scheme illustrated in FIG. 3 allows ample setup and hold times for all the logic blocks, and usually achieves a high resolution—less than 1 nanosecond (ns)—pulse width modulation.

Figure 4:
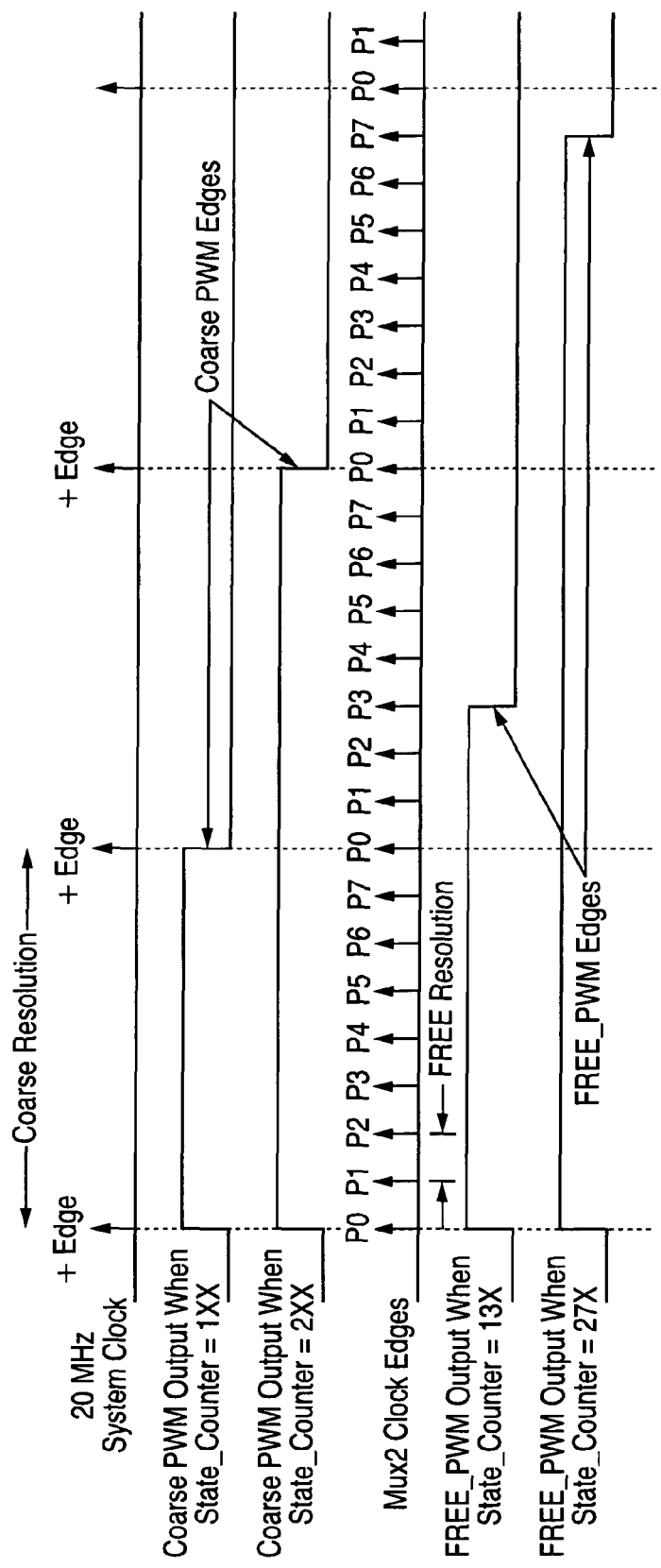
FIG. 4 is a timing diagram illustrating fine-resolution edge extender pulse width modulation according to one embodiment of the present invention.

FIG. 4 is a timing diagram illustrating fine-resolution edge extender pulse width modulation according to one embodiment of the present invention. The timing diagram corresponds to operation of the fine-resolution edge extender pulse width modulator depicted in FIG. 2. In the description below, the 10-bit PWM state counter value format of "ABC" indicates the value of the four most significant bits 202a by the hexadecimal digit A, the next three bits 202b by the hexadecimal digit B, and the three least significant bits 202c by the hexadecimal digit C. Thus, for example, a PWM state counter value of "12" (neglecting the three least significant bits for the time being) would indicate that the four most significant bits 202a of the counter value are binary 0001 (decimal 1) while the next three bits 202b of the counter value are binary 010 (decimal 2). The three least significant bits 202c (digit C) are not relevant to the fine-resolution edge extender scheme of the exemplary embodiment.

On leading, rising edges of the system clock, the coarse PWM output pulse equals a number of system clock cycles based on the 10-bit PWM state counter value, as controlled by the Mux1 output to first edge extender flip-flop 205 in the exemplary embodiment. Thus, for example, where the PWM state counter value is 1XX (where "X" indicates "don't care"), the coarse PWM output pulse from 4-bit pulse width modulator and logic unit 203 will be one system clock cycle in duration. Similarly, where the PWM state counter value is 2XX, the coarse PWM output pulse will be two clock cycles in duration. As long as the coarse PWM output from 4-bit pulse width modulator and logic unit 203 is asserted, that value EE1_D is clocked through the first edge extender flip-flop 205 to output EE1_Q on the rising edge of Mux1 (corresponding to phase P0).

While all of the Mux2 output edges are shown FIG. 4 for the purposes of describing the invention, in the physical implementation of the fine-resolution edge extender pulse width modulator only the selected phase will be active at the output Mux2. The selected phase at Mux2 clocks the output of first edge extender flip-flop 205 (EE1_Q=EE2_D) through to the output EE2_Q of the second edge extender flip-flop 206 on the rising edge of Mux2. Thus, for example, where the PWM state counter value is 13X, phase P3 will be selected to be output on Mux2 and will clock the output EE1_Q of first edge extender flip-flop 205 through the second edge extender flip-flop 206 to the output EE2_Q. Similarly, if the PWM state counter value is 27X, phase P7 will be selected to be output on Mux2 and will clock the second edge extender flip-flop 206.

In operation, the logic OR gate OR_1 producing the output of the fine-resolution edge extender pulse width modulator (FREE-PWM) of FIG. 2 combines the outputs of first and second edge extender flip-flops 205 and 206 to produce the output signal FREE-PWM output. For example, when the PWM state counter value is 13X, the coarse PWM output from logic unit 203 is asserted for one system clock cycle, clocked through first edge extender flip-flop 205 by the rising edge of phase P0 on output Mux1. During that cycle, the asserted output EE1_Q from the first edge extender flip-flop 205 is clocked through second edge extender flip-flop 206 by the rising edge of phase P3 on Mux2. Thus, when the output EE1_Q of the first edge extender flip-flop 205 is unasserted upon the rising edge of the next system clock pulse (phase P0), the output of second edge extender flip-flop 206 remains asserted until the next rising edge of phase P3, extending the trailing edge of the FREE-PWM output signal.

Similarly, if the PWM state counter value is 27X, the coarse PWM output from logic unit 203 is asserted for two system clock cycles, and clocked through first edge extender flip-flop 205 by two consecutive rising edges of phase P0. During those two system clock cycles, the output EE1_Q is clocked through second edge extender flip-flop 206 by two consecutive rising edges of phase P7, such that output EE2_Q of second edge extender flip-flop 206 (and hence FREE-PWM output) remains asserted until the next subsequent rising edge of phase P7, extending the trailing edge of the FREE-PWM output signal.

Figure 5A:
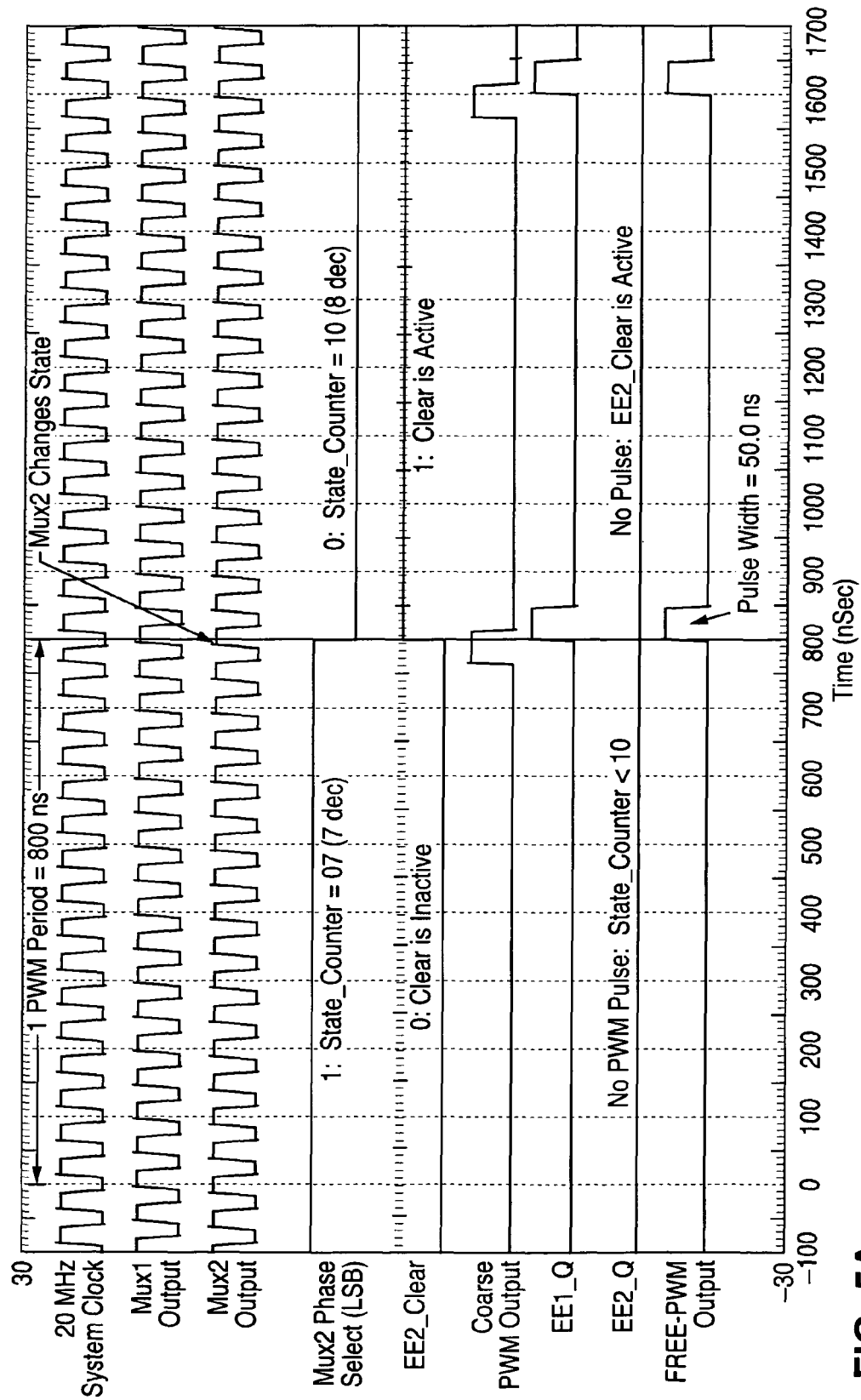
FIGS. 5A through 5C are timing waveforms for the operation of a fine-resolution edge extender pulse width modulator according to one embodiment of the present invention.
Figure 5B:
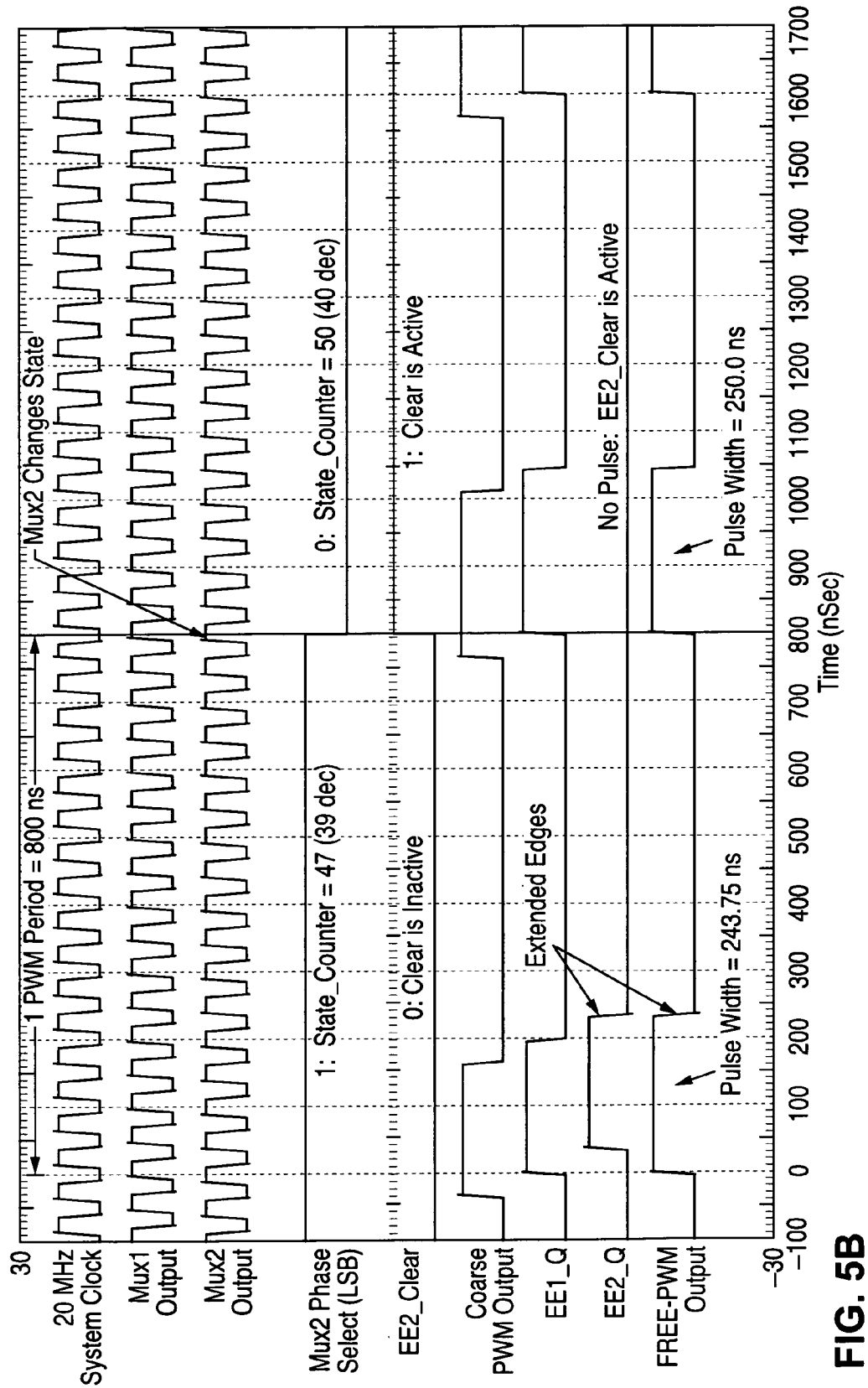
Figure 5C:
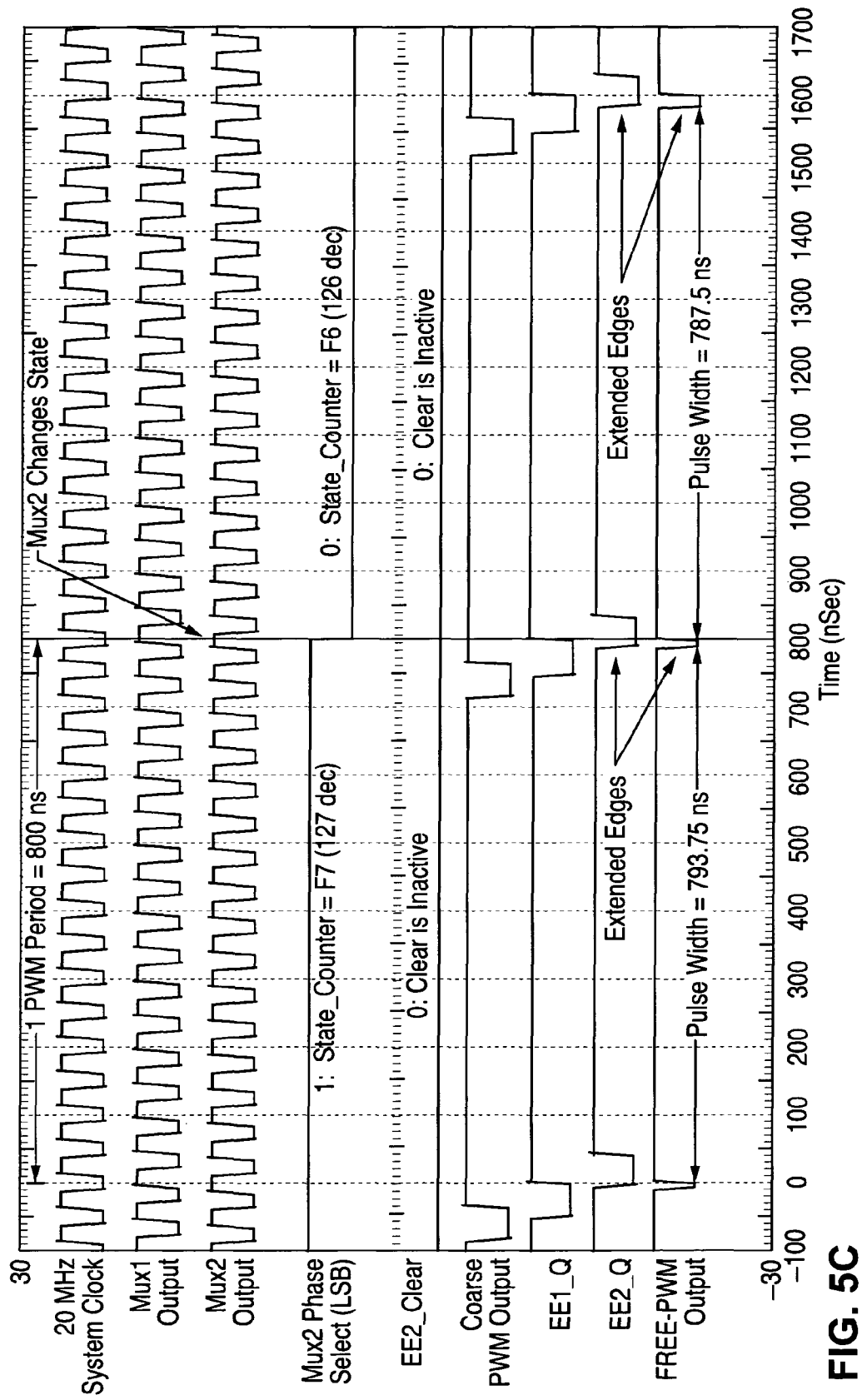

FIGS. 5A through 5C are timing waveforms for the operation of a fine-resolution edge extender pulse width modulator according to one embodiment of the present invention. The PWM state counter values in parentheses are decimal ("dec") values.

The fine-resolution edge extender multi-phase clocking scheme of the present invention increases pulse width modulation resolution by a factor of eight. Resolution may be further increased by increasing the number of phases produced by ring-oscillator and PLL 102. No calibration is required since the system clock generator (e.g., the multi-phase ring-oscillator and PLL in the exemplary embodiment) may be locked to an external clock reference. All logic timing is derived from the multi-phase ring-oscillator and PLL, resulting in accurate pulse width generation through a digitally timed pulse width modulation output without the need for pulse width trimming. Better than 1 ns resolution may usually be achieved with currently available complementary metal-oxide-semiconductor (CMOS) fabrication processes, and the output interfaces seamlessly to precision dead-time and dither logic blocks (described below), with all switching timing accuracy across all three functional units determined by the common multi-phase ring-oscillator and PLL. All paths are feed-forward, with no glitches arise from multi-clock feedback logic and no complex multi-phase clocks cluttering up the main pulse width modulation logic. The design is all digital (except for the analog multi-phase ring-oscillator and PLL generating the system clocks), fully synthesizable and testable, such that bus-controlling functions are easy to add. Performance does not degrade because of process-voltage-temperature changes since no dynamic signal adaptation within the clock generator is required.

Figure 6:
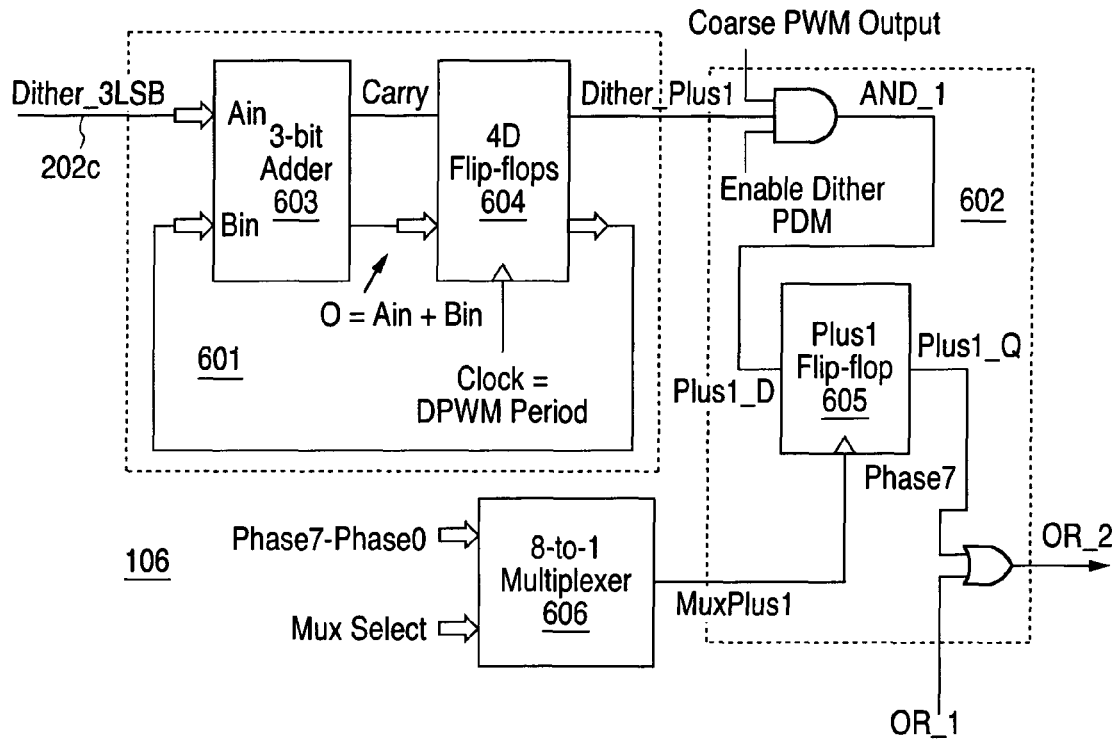
FIG. 6 depicts in greater detail a simplified circuit diagram for a dithering pulse-density modulator according to one embodiment of the present invention.

FIG. 6 depicts in greater detail a simplified circuit diagram for a dithering pulse-density modulator according to one embodiment of the present invention. Three-bit dither pulse density modulator 106 implements the two dithering functions of density generator and "Plus1" generator with two simple circuits: a pulse-density modulator 601 to convert the PWM_State counts to a pulse-density modulated signal, and a "Plus1" pulse generator to advance the basic digital pulse width modulator pulse width by one hardware resolution (i.e., from PWM_State to PWM_State+1).

FIG. 6 depicts an exemplary 3-bit pulse-density modulator 601 producing a density selection signal output Dither_Plus1 that is fed, in turn, to a "Plus1" pulse generator 602. When Dither_Plus1 is asserted, the Plus1 pattern is enabled, while the normal patter is selected whenever Dither_Plus1 is not asserted. The density function of Dither_Plus1 is controlled by the three least significant bits 202c ("Dither_3LSB") from the 10-bit PWM state counter 201 and has a range from ⅛ to ⅞ with a step size of ⅛.

In the exemplary embodiment depicted in FIG. 6, pulse-density modulator 601 is implemented by a 3-bit adder 603 with a carry output and four edge-triggered D flip-flops 604 producing a Dither_Plus1 output. Adder 603 receives three bits 202c from the 10-bit PWM state counter 201 as operand Ain during each system clock cycle, and adds those three bits to an operand Bin received through a feedback loop from flip-flops 604. The output O equals the sum of operands Ain and Bin, and Carry is the high-order carry (if any) generated by addition of Ain and Bin. Output O is clocked through flip-flops 604 to become operand Bin during the next system clock cycle, and Carry is clocked through flip-flops 604 to the Dither_Plus1 output.

The density of asserted outputs for Dither_Plus1 is given by:

$$\text{Density} = \frac{\text{Carry1s}}{\text{Clocks}} = \frac{1}{K(j-i)}\left(\sum_{n=i}^{j} Ain_n + O_i - O_j\right)$$

where i is the ith sample, j is the jth sample, K is 2 m (m=number of adder bits), Carry1s is the number of carry values equal to one from i to j, and clocks is the number of clocks from 1 to j. In the exemplary embodiment employing a 3-bit adder 603, with resolution of ⅛th steps, the Dither_Plus1 pulse density across eight system clock cycles (i.e., eight cycles of phase P0) ranges from 0/8th to 7/8th in ⅛th step increments depending on the value of the three least significant bits 202c (Dither_3LSB).

Figure 7:
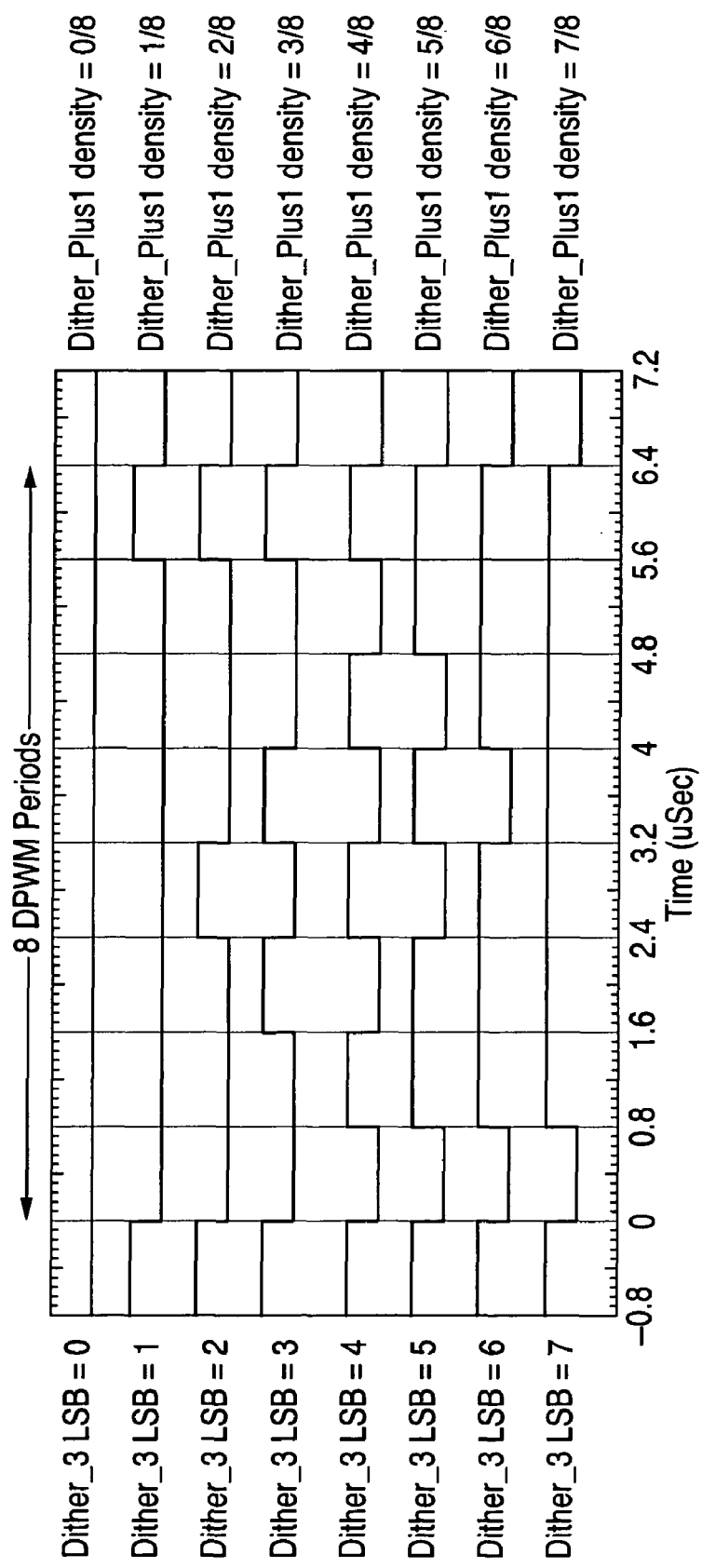
FIG. 7 is a timing diagram illustrating dither pulse density as a function of the pulse width modulator state counter three least significant bits in accordance with one embodiment of the present invention.

FIG. 7 is a timing diagram illustrating dither pulse density as a function of the pulse width modulator state counter three least significant bits in accordance with one embodiment of the present invention. The Dither_Plus1 density is illustrated for possible Dither_3LSB values for the implementation of pulse-density modulator 601 in the exemplary embodiment. As can be seen, the value of Dither_3LSB results in a corresponding number of Dither_Plus1 pulses during an eight system clock cycle period, with the pulses spread across the eight clock cycles.

Referring back to FIG. 6, Plus1 pulse generator 602 advances the rising edges of the basic digital pulse width modulator pulse stream (the output signal OR_1) utilizing an edge-triggered D flip-flop 605 and the existing multi-phase clock from the 20 MHz 8-phase ring-oscillator and PLL 102. The D flip-flop 605 together with logical AND gate AND_1 (producing a corresponding output signal AND_1) and logical OR gate OR_2 (producing corresponding output signal OR_2) form the complete Plus1 pulse generator 602.

Logic gate AND_1 receives the Dither_Plus1 signal from pulse-density modulator 601, the Coarse PWM Output signal from 4-bit pulse width modulator and logic unit 203, and an enable signal Enable Dither PDM from a control register (not shown), logically combining those inputs to produce the AND_1 output signal. The AND_1 signal is received as an input Plus1_D by Plus1_D flip-flop 605, and clocked through to output Plus1_Q. Flip-flop 605 is clocked by Phase7 from the ring-oscillator and phase-locked loop 102, with an 8-to-1 multiplexer 606 receiving Phase0 through Phase7 as inputs and Mux Select control signals always selecting (for the purposes of dithering) Phase7 at the MuxPlus1 output thereof. Multiplexer 606 is added to offset the delay of the Mux1 output from 8-to-1 clock multiplexer 204.

The output of flip-flop 605 is logically combined with the OR_1 signal from the fine-resolution, edge extender digital pulse width modulator 105 to produce the output signal OR_2, forward to dead-time logic 107. Output signal OR_2 is the fine-resolution, edge extender digital pulse width modulator output signal OR_1 with dithering, by rising edge advancement.

Figure 8:
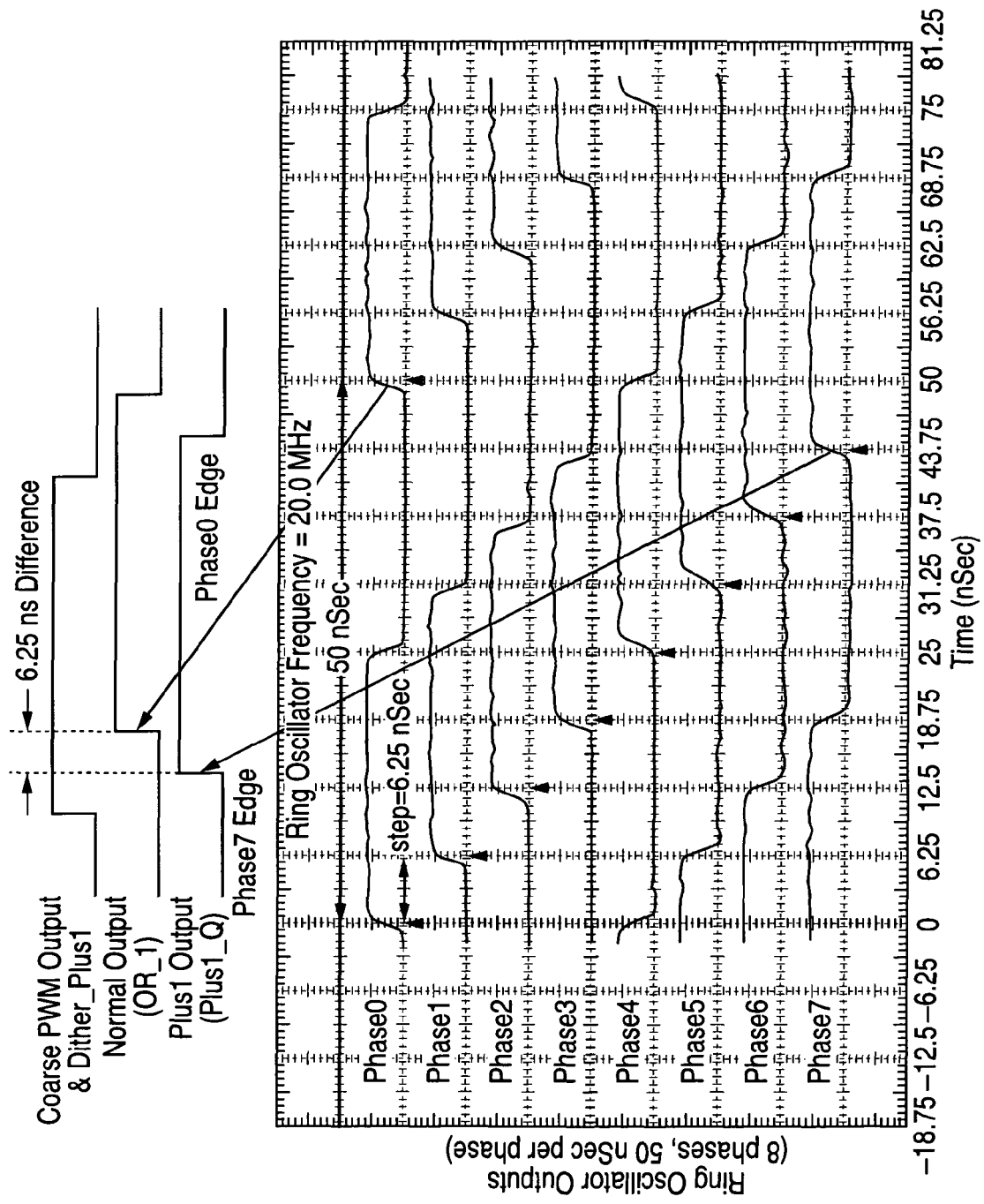
FIG. 8 is a timing diagram illustrating rising edge advancement by a dithering pulse-density modulator according to one embodiment of the present invention.

FIG. 8 is a timing diagram illustrating rising edge advancement by a dithering pulse-density modulator according to one embodiment of the present invention. As noted above, the FREE-PWM output with dithering OR_2 is based at least partly on a logical combination of the Coarse PWM output from pulse width modulator and logic unit 203 with the Dither_Plus1 output of the pulse-density modulator 601 (signal AND_1). The rising edge of the normal output OR_1 from the fine-resolution, edge extender digital pulse width modulator 105 is delayed with respect to the rising edge of signal AND_1, and is triggered by the rising edge of Phase0. The Plus1 output Plus1_Q, when activated for dithering, is triggered by the rising edge of Phase7 and thus advances the rising edge of the OR_2 output signal by one clock phase duration relative to the rising edge of signal OR_1.

Figure 9A:
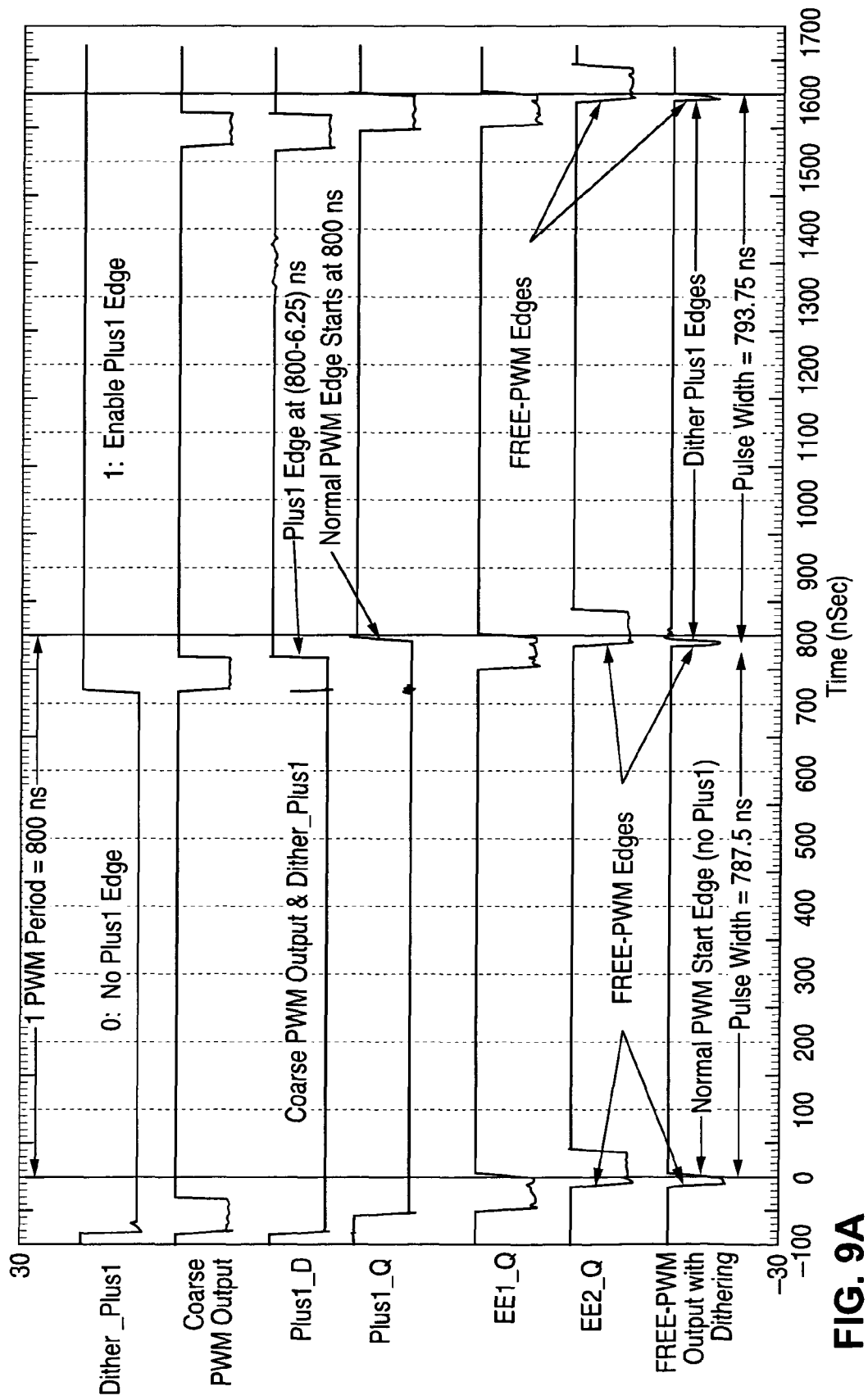
FIGS. 9A and 9B are timing waveforms for the operation of a dithering pulse-density modulator according to one embodiment of the present invention.
Figure 9B:
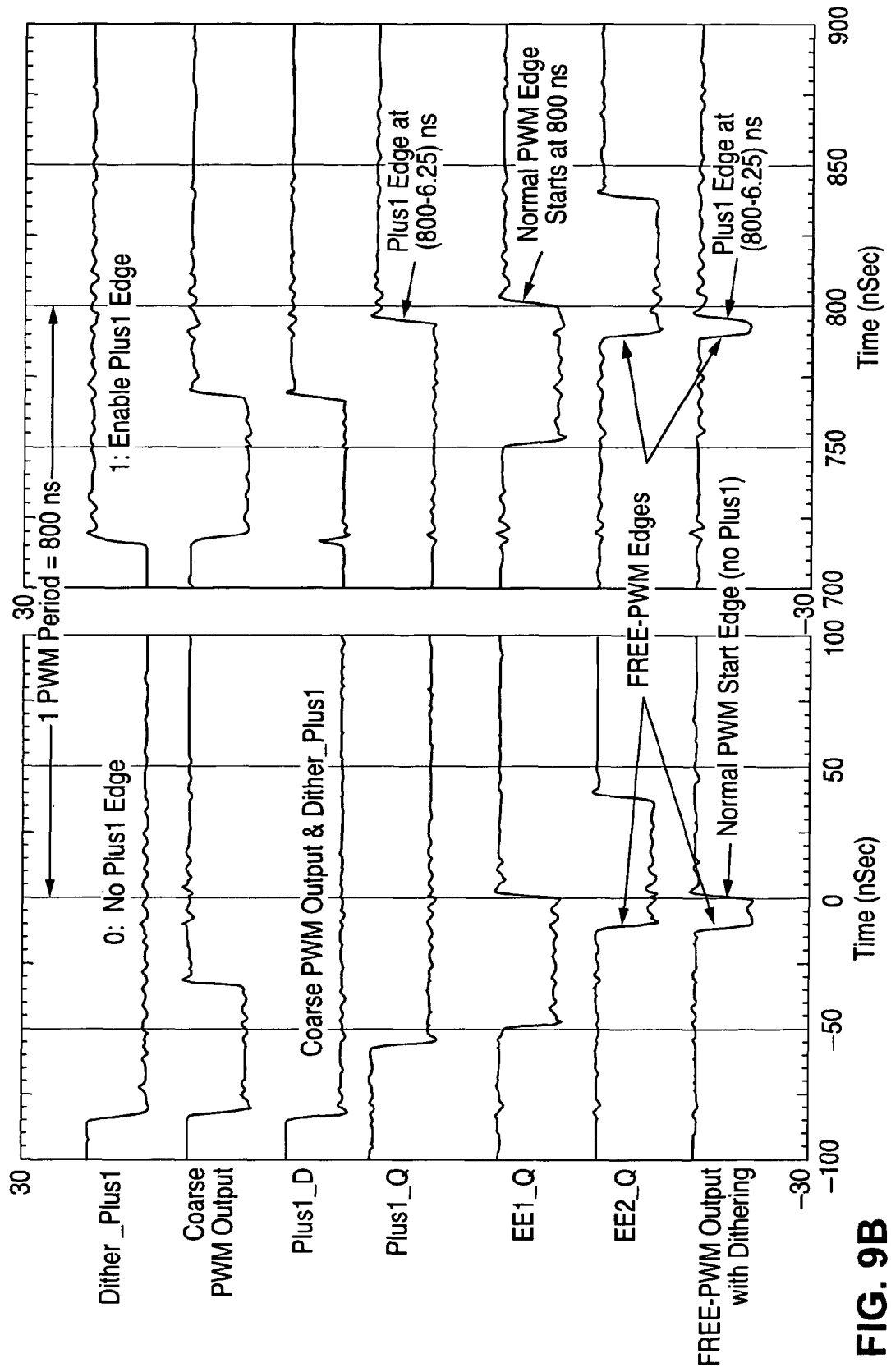

FIGS. 9A and 9B are timing waveforms for the operation of a dithering pulse-density modulator according to one embodiment of the present invention. Both timing waveforms correspond to a PWM state counter value of F67 (1015 decimal), with FIG. 9B showing and enlarged view of the pulse edges depicted in FIG. 9A.

Since the rising edges signify the start of digital pulse width modulator periods and are fixed in time, very little processing overhead is required to generate the Plus1 pulses using the exemplary embodiment. Subsequent falling edges vary in time due to pulse width control by the edge extender digital pulse width modulator, and are therefore less favorable for implementing the Plus1 function.

While described in the context of a 10-bit fine-resolution edge extender pulse width modulator, the dither pulse-density modulator architecture depicted in FIG. 6 is simple and applicable to virtually all digital pulse width modulators. Unlike many traditional methods using read-only memory (ROM) lookup tables or logic sequencers, the pulse-density modulator approach of the present invention is not a sequencer and requires neither start nor stop states, such that inputs to the pulse-density modulator may be applied in any sequence and combination. In addition, the spectral content at the final digital pulse width modulator output is mostly high frequencies (in contrast to some ROM lookup designs with strong low frequency content), and therefore contribute less noise to the final digital pulse width modulator output. The pulse-density modulator has a low cost-per-bit overhead, so higher resolution may be easily achieved by simply adding more bits to the pulse-density modulator adder (e.g., using a 4-bit adder to achieve $1/16^{th}$ steps, a 5-bit adder for $1/32^{nd}$ steps, etc.).

Many traditional approaches also use adders and registers to calculate and store Plus1 states, with sequencers followed by ROM lookup tables also usually required due to inadequate hardware resolution. Such blocks complicate the design and may introduce timing difficulties. In contrast, the D flip-flop approach of the exemplary embodiment is simple and elegant, exhibiting perhaps the lowest processing latency delay and an ideal circuit for building high performance responsive loops. Less circuit (or processing) delay allows the digital pulse width modulator loop dynamics to be optimized without adding unnecessary pole-and-zero compensators.

Figure 10:
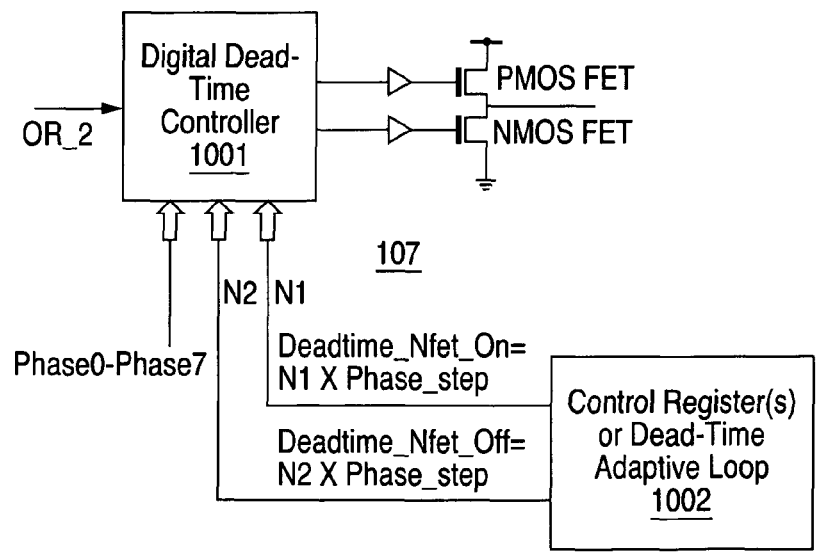
FIG. 10 depicts a high-level block diagram of a digital dead-time controller sharing a multi-phase ring-oscillator and phase locked loop with a digital pulse width modulator according to one embodiment of the present invention.

FIG. 10 depicts a high-level block diagram of a digital dead-time controller sharing a multi-phase ring-oscillator and phase locked loop with a digital pulse width modulator according to one embodiment of the present invention. If the ring-oscillator 102 employed by digital pulse width modulator 105 is shared by digital dead-time controller 1001 within dead-time logic 107, an ideal digital pulse width modulator providing accurate timing performance of a wide range of process-voltage-temperature changes results.

Two important dead-time parameters shown in FIG. 10 are Deadtime_NFet_On and Deadtime_NFet_Off. Digital dead-time controller 1001 receive these control parameters from control registers or dead-time adaptive loop 1002, with Deadtime_NFet_On equaling a control value N1 times the phase difference (Phase_step) between consecutive phases within Phase0 to Phase7 from ring-oscillator 102, and Deadtime_NFet_Off equaling N2 times the phase difference Phase_step. In the exemplary embodiment, Phase_step=1/(20 MHz×8 phases)=6.25 ns.

Digital dead-time controller 1001 receives as an input the digital pulse width modulator output signal with dithering OR_2. Digital dead-time controller 1001 also receives as controls the outputs Phase0-Phase7 of ring-oscillator 102, and parameters Deadtime_NFet_On and Deadtime_NFet_Off. Digital dead-time controller 1001 outputs two signals for driving the complimentary MOSFET transistors PMOS FET and NMOS FET. Dead-time delays are inserted in those outputs.

Figure 11:
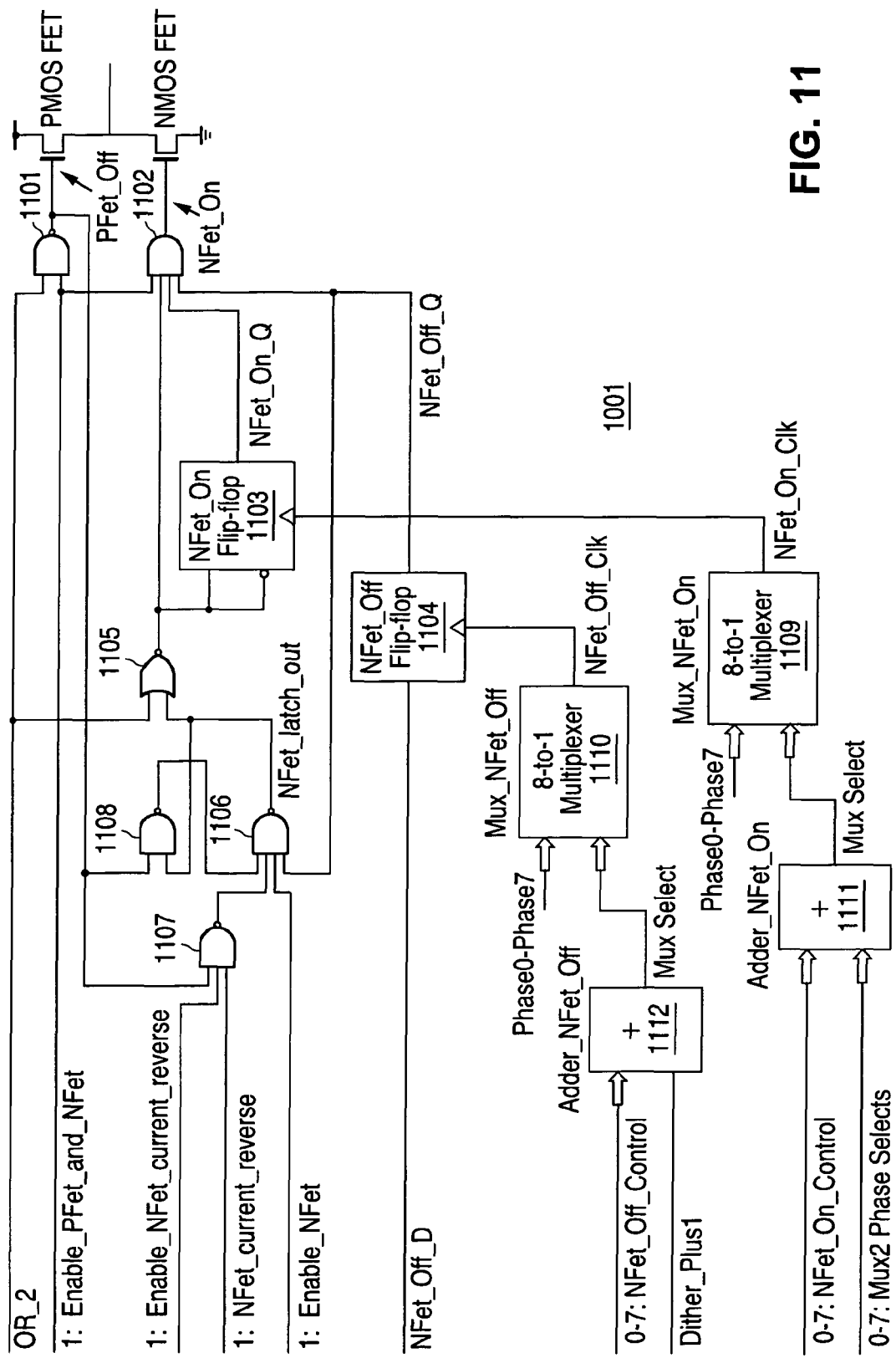
FIG. 11 depicts in greater detail an exemplary embodiment of a digital dead-time controller sharing a multi-phase ring-oscillator and phase locked loop with a digital pulse width modulator according to one embodiment of the present invention.

FIG. 11 depicts in greater detail an exemplary embodiment of a digital dead-time controller sharing a multi-phase ring-oscillator and phase locked loop with a digital pulse width modulator according to one embodiment of the present invention. Digital dead-time controller 1001 receives the FREE-PWN output with dithering OR_2 as an input to a logic NAND gate 1101, which also receives as another input an Enable_PFet_and_NFet signal from a control register(s) 1002 or a switcher house-keeping state machine (not shown). The output of NAND gate 1101 produces a PFet_Off signal controlling the PMOS FET, while the NMOS FET is controlled by a NFet_On signal produced by a logic AND gate 1102.

The logic AND gate 1102 also receives the Enable_PFet_and_NFet signal as an input, and also receives as inputs NFet_On_Q and NFet_Off_Q outputs from NFet_On flip-flop 1103 and NFet_Off flip-flop 1104, respectively. The fourth input to AND gate 1102 is received from logic NOR gate 1105, which in turn receives as inputs the OR_2 signal and an NFet_latch_out signal. NFet_latch_out signal is produced by a logic NAND gate 1106, which receives as inputs the NFet_Off_Q signal, an Enable_NFet signal from control register(s) 1002 or a mode-select state machine, an output from a logic NAND gate 1107, and an output from a logic NAND gate 1108. NAND gates 1107 and 1108 both receive as inputs thereto the PFet_Off signal, with NAND gate 1107 also receiving an Enable_NFet_current_reverse signal from control register(s) 1002 or a mode-select state machine and an NFet_current_reverse from an NMOS FET current-reverse sensing comparator (not shown) as inputs and NAND gate 1108 also receiving the NFet_latch_out signal as the other input.

NFet_On flip-flop 1103 receives the output of NOR gate 1105 and an inversion of the output of NOR 1105 at an input and an inverting input, respectively, and is clocked by NFet_On_Clk produced by 8-to-1 Mux_NFet_On multiplexer 1109. The input to NFet_Off flip-flop 1104 is an NFet_Off_D signal, a 50 ns pulse generated before the start of each pulse width modulation period, exhibiting a fixed position and width and decoded by the 4-bit pulse width modulator and logic unit 203. NFet_Off flip-flop 1104 is clocked by an NFet_Off_Clk signal produced by 8-to-1 Mux_NFet_Off multiplexer 1110.

The Phase0-Phase7 outputs from ring-oscillator 102 are received as inputs to both Mux_NFet_On multiplexer 1109 and Mux_NFet_Off multiplexer 1110. The Mux Select inputs to Mux_NFet_On multiplexer 1109 are received from Adder_NFet_On adder 1111, while the Mux Select inputs to Mux_NFet_Off multiplexer 1110 are received from Adder_NFet_Off adder 1112. The inputs to Adder_NFet_On adder 1111 are a set of NFet_On_Control signals from the control register(s) or dead-time adaptive logic 1002 and the Mux2 Phase Selects (bits 202b) from 10-bit pulse width modulator state counter 201. The inputs to Adder_NFet_On adder 1112 are a set of NFet_On_Control signals from the control register(s) or dead-time adaptive logic 1002 and the Dither_Plus1 signal from dither pulse-density modulator 601.

NOR gate 1105, NFet_On flip-flop 1103, Mux_NFet_On multiplexer 1109, and Adder_NFet_On adder 1111 form Deadtime_NFet_On logic; NFET_Off flip-flop 1104, Mux_NFet_Off multiplexer 1110, and Adder_NFet_Off adder 1112 form Deadtime_NFet_Off logic; and NAND gates 1106-1108 form NFet_current_reverse_latch and disable logic.

Figure 12A:
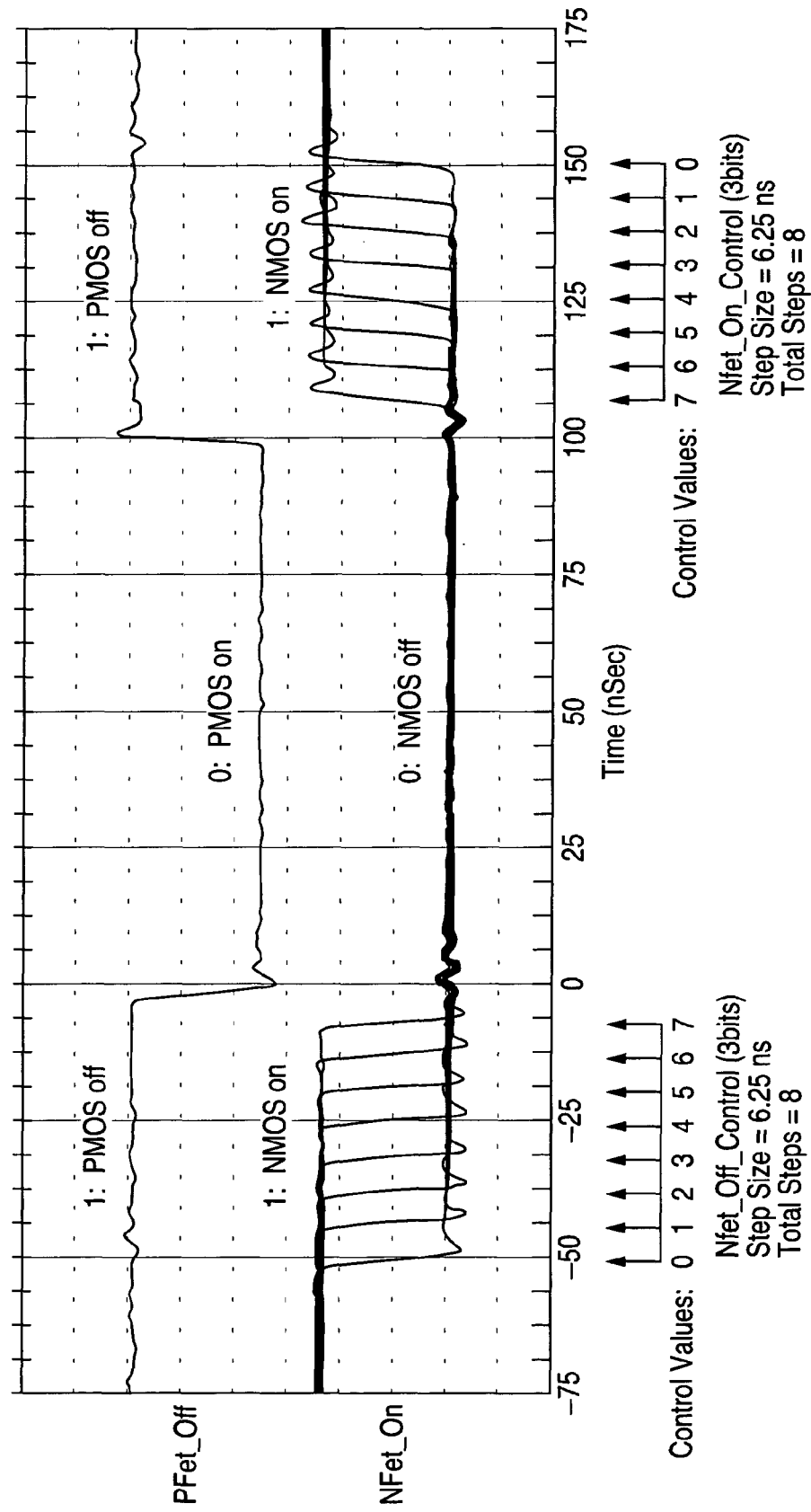
FIGS. 12A and 12B are timing waveforms for the operation a digital dead-time controller sharing a multi-phase ring-oscillator and phase locked loop with a digital pulse width modulator according to one embodiment of the present invention.
Figure 12B:
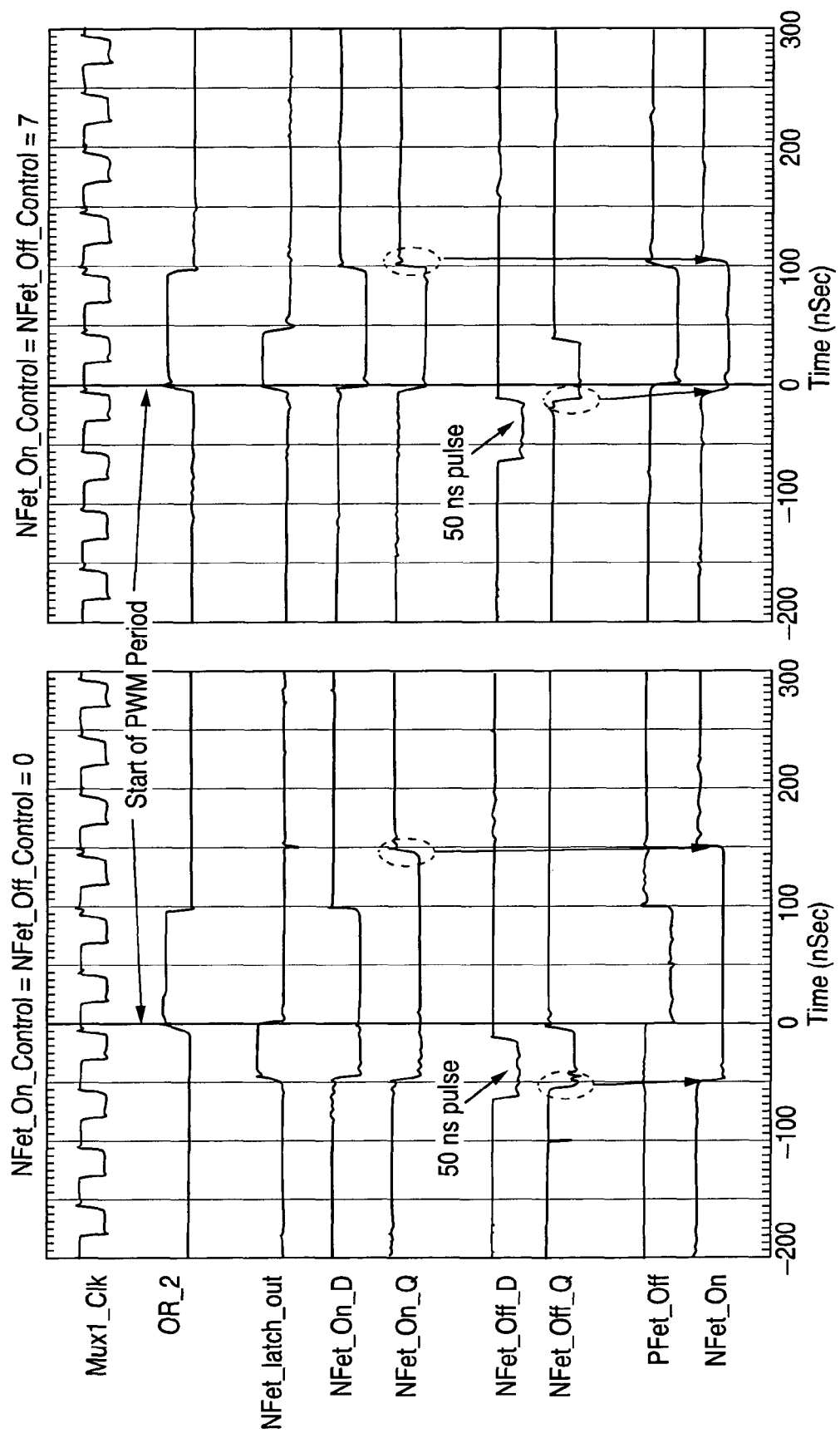

FIGS. 12A and 12B are timing waveforms for the operation a digital dead-time controller sharing a multi-phase ring-oscillator and phase locked loop with a digital pulse width modulator according to one embodiment of the present invention. The signals depicted correspond to State_Counter=200 (128 decimal). The circled edges in FIG. 12B determine dead-time delay timing, with arrows identifying corresponding output control signals.

Figure 13A:
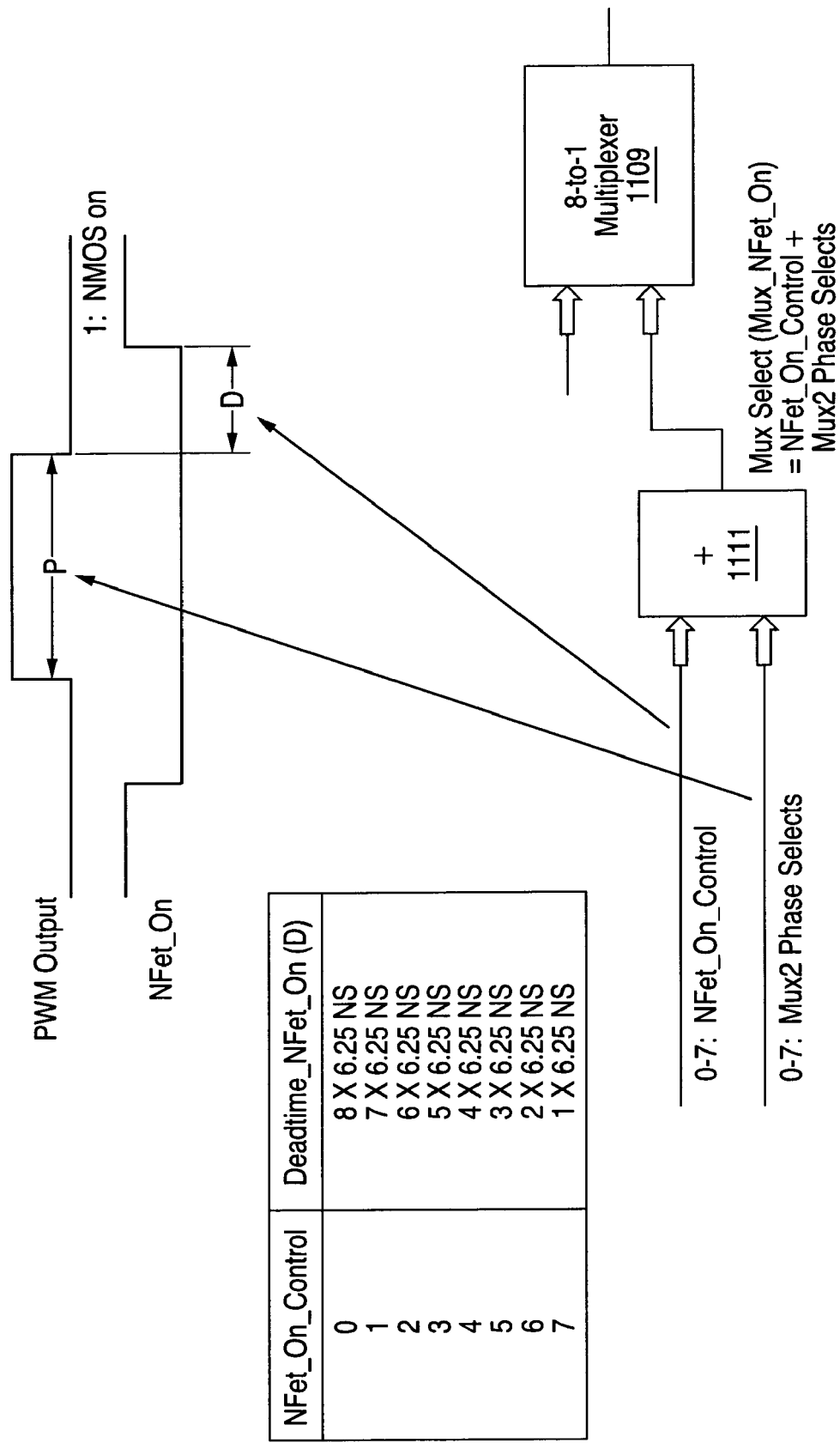
FIGS. 13A and 13B illustrate operation of dead-time delay control for a digital dead-time controller sharing a multi-phase ring-oscillator and phase locked loop with a digital pulse width modulator according to one embodiment of the present invention.
Figure 13B:
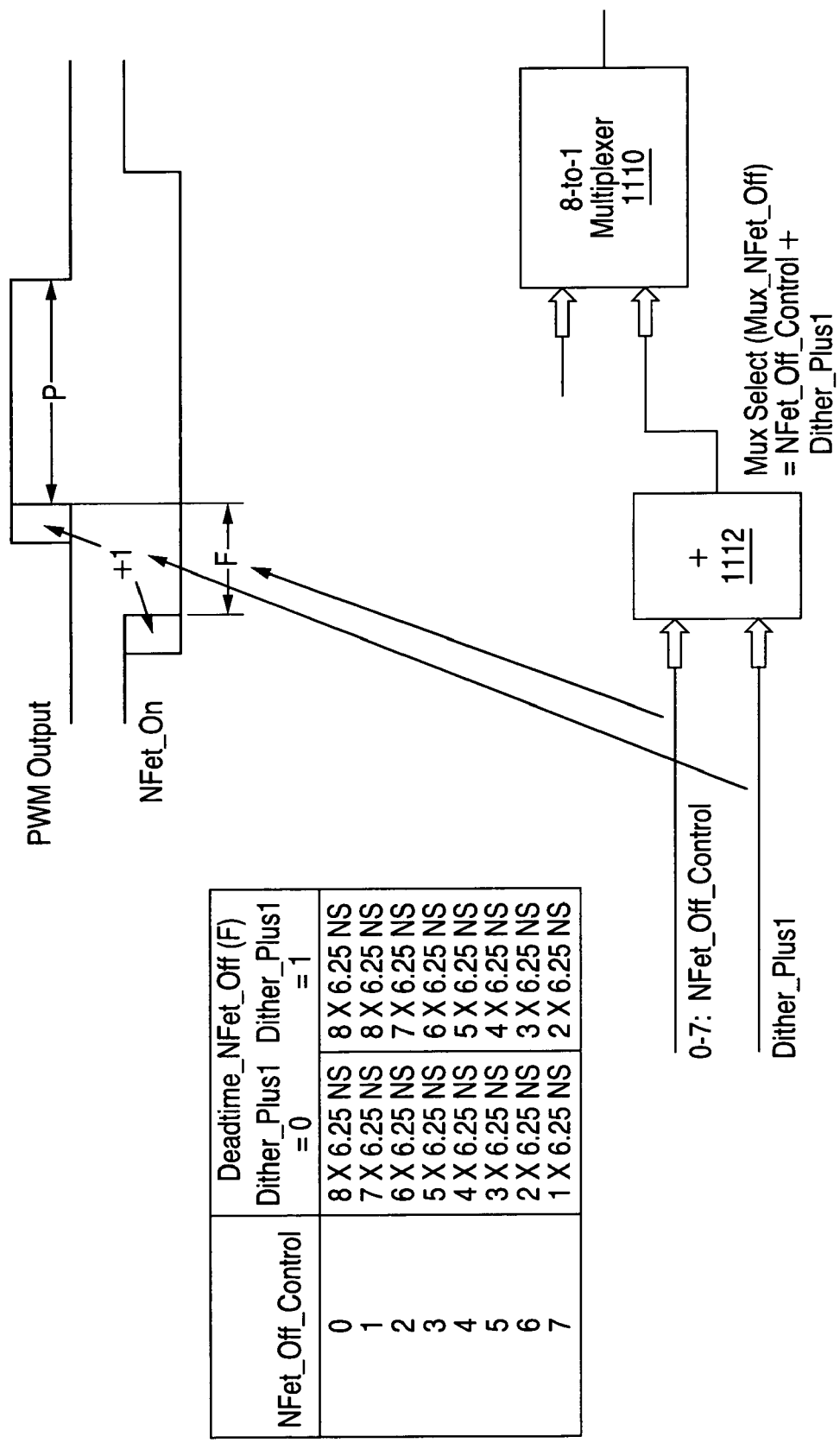

FIGS. 13A and 13B illustrate operation of dead-time delay control for a digital dead-time controller sharing a multi-phase ring-oscillator and phase locked loop with a digital pulse width modulator according to one embodiment of the present invention. The value in NFet_On_Control determines the delay time D of Deadtime_NFet_On, the lag after a PWM Output pulse P until NFet_On is asserted. Since P varies according to the values in PWM State_Counter and Mux2 Phase Selects, Mux Select is set to the sum of NFet_On_Control and Mux2 Phase Selects by Adder_NFet_On adder 1111 to maintain a constant delay time D. The value PWM State_Counter need not be added due to the unique FREE-PWM clocking scheme.

The value in NFet_Off_Control determines the delay time F of Deadtime_NFet_Off, the duration by which the falling edge of NFet_On leads the rising edge of a PWM Output pulse P. The rising edges of P may start earlier by +1 when the dither pulse-density modulator overflows. In order to compensate for the pulse shifting, Mux Select is set to the sum of NFet_Off_Control and Dither_Plus1 by Adder_NFet_Off adder 1112. This arrangement can thus maintain a constant lead time for F even when P changes position.

In the exemplary embodiment, the dead-time resolution is identical to the fine-resolution, edge extender pulse width modulation resolution (6.25 ns). Since the pulse width modulator 105 and the digital dead-time controller 1001 share a common multi-phase ring-oscillator 102 and the phase step of the ring-oscillator 102 controls the resolution, increasing either the operating frequency and/or the number of phases generated by the ring-oscillator 102 would increase resolution.

In the exemplary embodiment, the two dead-time parameters Deadtime_NFet_On and Deadtime_NFet_Off have independent controls, so their values can be either set by two registers or taken from the control outputs of an adaptive loop.

The digital dead-time controller described works seamlessly with the fine resolution, edge extender pulse width modulator and dither pulse-density modulator described above, forming a complete and robust digital pulse width modulator ideal for single-chip switcher applications. The solution is low cost and practical, and reduces circuit size by sharing common resources such as the multi-phase ring-oscillator, timing signals from the PWM period counter, etc., allowing a common timing source to control all logic activities and resulting in identical resolution and timing accuracy throughout the system.

The unique clocking scheme and the use of low number of clock phases make the dead-time control solution described practical and robust. Because of the simple clock sources, delay-matching of all clock multiplexers and associated logic for good timing correlations is possible, whereas delay-matching many clock phases and large multiplexers is difficult and impractical. In addition, the digital dead-time controller includes PMOS/NMOS interlocking and gating, NMOS-disable, and current-reverse-latch, control functions making the solution versatile in sophisticated multi-mode switcher applications.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A digital pulse width modulator comprising:
    a system clock signal generator; and
    a feed-forward logic circuit coupled to the system clock signal generator, wherein the circuit receives a system clock signal, produces a pulse having a leading edge at one of a plurality of phase offsets relative to the system clock signal based on a state counter value, and extends a trailing edge of the pulse following the duration of system clock periods by a predetermined number of fractional portions of the system clock period, wherein the pulse has a duration at least equal to a selected number of periods of the system clock signal, wherein the leading and trailing edges are separated by the selected number of system clock periods plus the selected number of fractional portions of the system clock period, wherein the plurality of phase offsets are used to perform a fine adjustment to an output of the pulse width modulator.

2. The digital pulse width modulator according to claim 1, wherein the feed-forward logic further comprises a ring-oscillator generating a number of phase-shifted versions of a system clock.

3. The digital pulse width modulator according to claim 2, wherein the feed forward logic further comprises at least one latch clocked by one of the phase-shifted versions of the system clock, the latch extending the trailing edge of the pulse.

4. The digital pulse width modulator according to claim 3, wherein the at least one latch further comprises:
    a second latch operating in parallel with the latch and clocked by the system clock; and
    a logic gate combining outputs of the latch and the second latch to form the pulse.

5. The digital pulse width modulator according to claim 4, wherein an input to the latch receives an output from the second latch.

6. The digital pulse width modulator according to claim 4, further comprising a multiplexer that receives the phase-shifted versions of the system clock and outputs the system clock on the first output and the one phase-shifted version of the system clock on the second output.

7. An integrated circuit including the digital pulse width modulator according to claim 4, the integrated circuit further comprising:
    an input receiving an external timing reference; and
    bus interface logic receiving external control signals.

8. A method of digital pulse width modulation comprising:
    receiving a system clock signal;
    utilizing feed-forward logic, producing a pulse having a leading edge at one of a plurality of phase offsets relative to the system clock signal based on a state counter value and a duration at least equal to a selected number of periods of the system clock signal and extending a trailing edge of the pulse following the duration of the selected number of system clock periods by a selected number of fractional portions of the system clock period so that the leading and trailing edges are separated by the selected number of system clock periods plus the selected number of fractional portions of the system clock period, wherein the plurality of phase offsets are used to perform a fine adjustment to a modulated output signal that includes the pulse.

9. The method according to claim 8, further comprising:
generating a number of phase-shifted versions of a system clock.

10. The method according to claim 9, further comprising:
clocking a latch extending the trailing edge of the pulse by one of the phase-shifted versions of the system clock.

11. The method according to claim 10, further comprising:
operating a second latch in parallel with the first latch;
clocking the second latch by the system clock; and
combining outputs of the latch and the second latch to form the pulse.

12. The method according to claim 11, furthering comprising:
receiving, at an input to the latch, an output from the second latch.

13. The method according to claim 11, further comprising:
multiplexing the phase-shifted versions of the system clock to output the system clock on a first output and the one phase-shifted version of the system clock on a second output.

14. A digital pulse width modulator comprising:
a ring-oscillator receiving a system clock and producing a plurality of phase-shifted versions of the system clock;
a multiplexer receiving the system clock and the plurality of phase-shifted versions of the system clock, the multiplexer outputting the system clock on a first output and one of the phase-shifted versions of the system clock on a second output; and
first and second latches, wherein the first output of the multiplexer is received as an input to the first latch, and the second output of the multiplexer is received as an input to the second latch, the first latch clocked by the first output of the multiplexer and the second latch clocked by the second output of the multiplexer, the second latch selectively extending a trailing edge of a pulse from the first latch by a selected number of phase divisions of a period of the system clock based upon a state counter value, wherein the second latch performs a fine adjustment to the output of the pulse width modulator.

15. The digital pulse width modulator according to claim 14, further comprising:
a logic gate combining outputs of the first and second latches to produce the pulse.

16. The digital pulse width modulator according to claim 15, further comprising:
a programmable state counter providing the state counter value for controlling the number of phase divisions by which the trailing edge is extended.

17. The digital pulse width modulator according to claim 16, wherein the second latch receives, at a second input thereof, the output of the first latch.

18. The digital pulse width modulator according to claim 17, further comprising:
a pulse width modulator receiving a signal from the state counter and producing an output pulse having a duration equal to a selected number of system clock periods, wherein the output pulse is received at a second input to the first latch.

19. The digital pulse width modulator according to claim 17, wherein the multiplexer passes through the system clock to the first output from which the first latch is clocked.

20. An integrated circuit including the digital pulse width modulator according to claim 17, the integrated circuit further comprising:
an input receiving an external timing reference; and
bus interface logic receiving external control signals.

* * * * *